(12) United States Patent
Yang et al.

(10) Patent No.: US 10,991,877 B2
(45) Date of Patent: Apr. 27, 2021

(54) MULTI-STATE MEMORY AND METHOD FOR MANUFACTURING THE SAME

(71) Applicant: INSTITUTE OF MICROELECTRONICS, CHINESE ACADEMY OF SCIENCES, Beijing (CN)

(72) Inventors: Meiyin Yang, Beijing (CN); Jun Luo, Beijing (CN); Sumei Wang, Beijing (CN); Jing Xu, Beijing (CN); Yanru Li, Beijing (CN); Junfeng Li, Beijing (CN); Yan Cui, Beijing (CN); Wenwu Wang, Beijing (CN); Tianchun Ye, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 30 days.

(21) Appl. No.: 16/560,357

(22) Filed: Sep. 4, 2019

(65) Prior Publication Data
US 2020/0303635 A1 Sep. 24, 2020

(30) Foreign Application Priority Data
Mar. 19, 2019 (CN) .......................... 201910208579.3

(51) Int. Cl.
*H01L 43/12* (2006.01)
*H01F 41/32* (2006.01)
(Continued)

(52) U.S. Cl.
CPC ............ *H01L 43/12* (2013.01); *G11C 11/161* (2013.01); *G11C 11/5607* (2013.01);
(Continued)

(58) Field of Classification Search
CPC ......... H01L 43/12; H01L 43/02; H01L 43/10; H01L 27/222; H01F 41/32;
(Continued)

(56) References Cited

U.S. PATENT DOCUMENTS

2015/0069551 A1* 3/2015 Toko ........................ H01L 43/08
257/421
2015/0255712 A1* 9/2015 Tsubata .................. H01L 27/228
257/295

(Continued)

*Primary Examiner* — Sitaramarao S Yechuri
(74) *Attorney, Agent, or Firm* — Goodwin Procter LLP

(57) ABSTRACT

A multi-state memory and a method for manufacturing the same. A magnetoresistive tunnel junction is disposed on a spin-orbit coupling layer, and thermal annealing is performed after dopant ions are injected from a side of the magnetoresistive tunnel junction. The concentration of dopant ions in the magnetoresistive tunnel junction has a gradient variation along the direction that is perpendicular to the direction of the current and within the plane in which the spin-orbit coupling layer is located. Symmetry along the direction perpendicular to the direction of the current is broken. In a case a current flows into the spin-orbit coupling layer, resistance are outputted in multiple states in linearity with the current. The multi-state storage is achieved. It can meet a requirement on hardware of neural network synapses, and is applicable to calculation in a neural network.

11 Claims, 11 Drawing Sheets

(51) Int. Cl.
  *H01F 10/32*   (2006.01)
  *G11C 11/16*   (2006.01)
  *H01L 43/02*   (2006.01)
  *H01L 43/10*   (2006.01)
  *G11C 11/56*   (2006.01)
  *H01L 27/22*   (2006.01)

(52) U.S. Cl.
  CPC ....... *H01F 10/329* (2013.01); *H01F 10/3259* (2013.01); *H01F 10/3286* (2013.01); *H01F 41/32* (2013.01); *H01L 27/222* (2013.01); *H01L 43/02* (2013.01); *H01L 43/10* (2013.01); *G11C 2211/5615* (2013.01)

(58) Field of Classification Search
  CPC ............... H01F 10/3259; H01F 10/329; H01F 10/3286; G11C 11/161; G11C 11/5607; G11C 2211/5615
  See application file for complete search history.

(56) References Cited

U.S. PATENT DOCUMENTS

| | | | |
|---|---|---|---|
| 2017/0025603 A1* | 1/2017 | Hara | H01L 43/02 |
| 2018/0076261 A1* | 3/2018 | Yoshikawa | H01L 43/12 |
| 2019/0051819 A1* | 2/2019 | Miura | H01L 27/228 |
| 2019/0109277 A1* | 4/2019 | Jan | H01L 43/08 |
| 2020/0227474 A1* | 7/2020 | O'Brien | H01L 43/14 |

\* cited by examiner

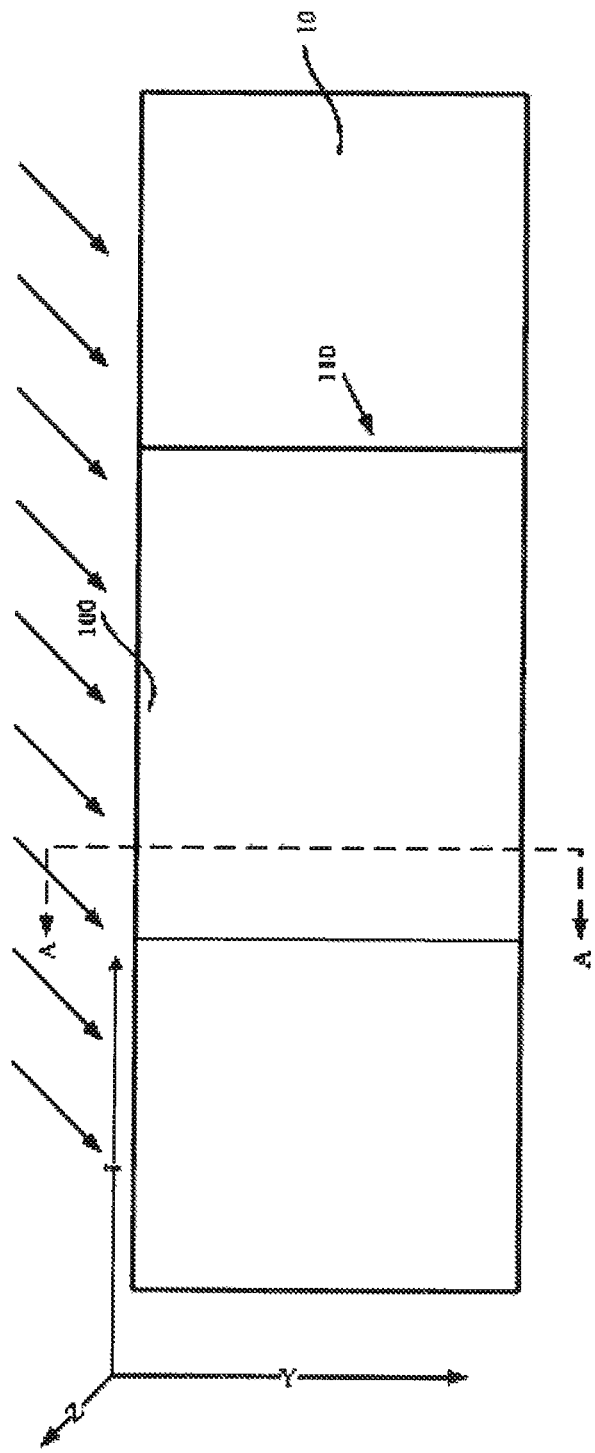

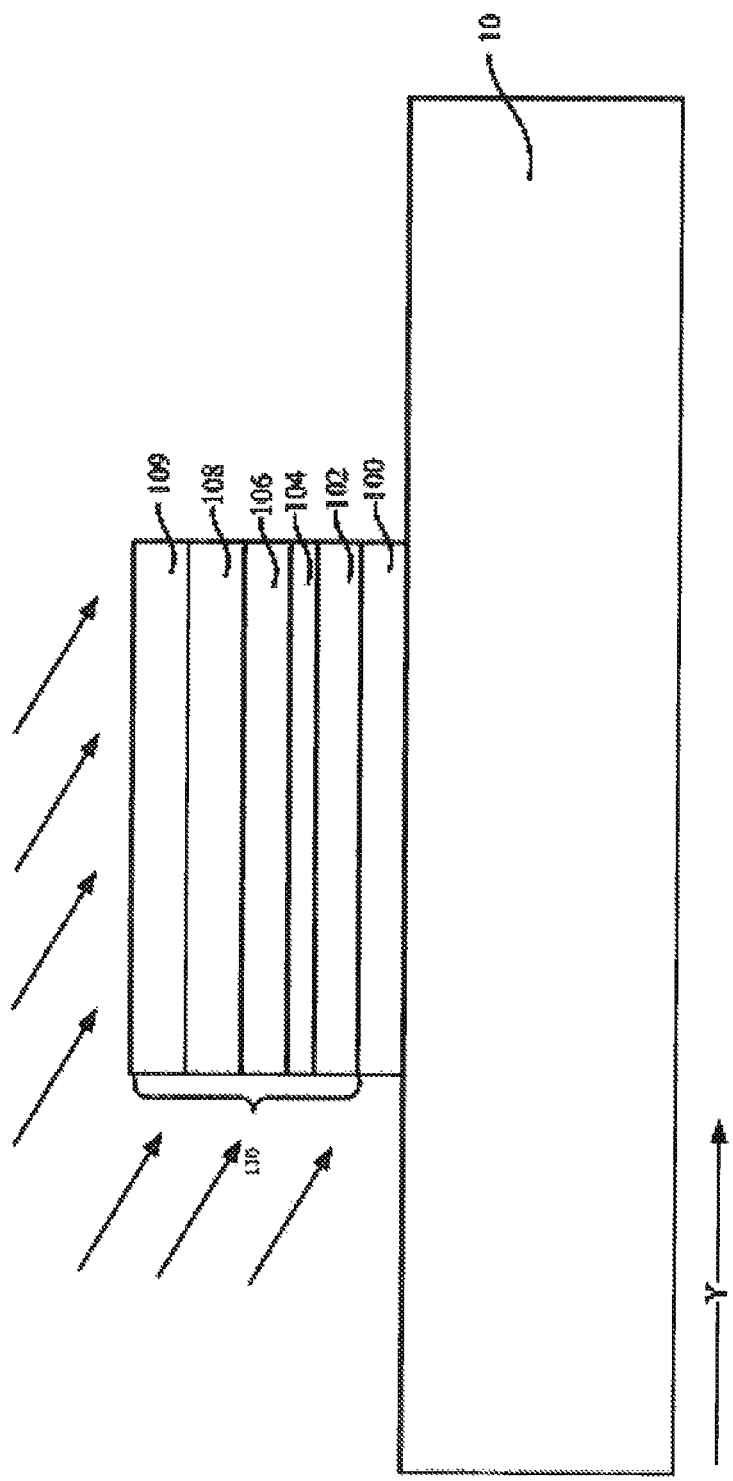

MULTI-STATE MEMORY AND METHOD FOR MANUFACTURING THE SAME

The present application claims priority to Chinese Patent Application No. 201910208579.3, titled "MULTI-STATE MEMORY AND METHOD FOR MANUFACTURING THE SAME", filed on Mar. 19, 2019 with the China National Intellectual Property Administration, which is incorporated herein by reference in its entirety.

FIELD

The present disclosure relates to the technical field of semiconductor devices and manufacture thereof, and in particular, to a multi-state memory and a method for manufacturing the multi-state memory.

BACKGROUND

With wide application of artificial intelligence technology, applying storage technology to neural network becomes a hot topic of research. In the neural network, information processing is achieved by adjusting interconnections among a large number of internal synapses on a basis of system complexity. A conventional memory merely stores data in two states, 0 and 1. In case of a memory storing data in more states, namely, being capable to achieve multi-state storage, the memory can meet a requirement on hardware of the neural network synapses, and thereby can be applied to calculation in the neural network.

SUMMARY

In view of the above, an objective of the present disclosure is to provide a multi-state memory and a method for manufacturing the multi-state memory, so as to achieve multi-state data storage in a memory.

In order to achieve the above objective, following technical solutions are provided according to the present disclosure.

A method for manufacturing a multi-state memory, including:
providing a substrate;
forming a spin-orbit coupling layer on the substrate:
forming a magnetoresistive tunnel junction on the spin-orbit coupling layer, where the magnetoresistive tunnel junction includes a first magnetic layer, a tunneling layer and a second magnetic layer that are sequentially stacked from bottom to top, and the first magnetic layer and the second magnetic have perpendicular anisotropy;
injecting dopant ions from a side of the magnetoresistive tunnel junction; and
performing thermal annealing.

Optionally, injecting the dopant ions from a side of the magnetoresistive tunnel junction includes:
forming a mask layer on another side of the magnetoresistive tunnel junction;
injecting the dopant ions; and
removing the mask layer.

Optionally, injecting the dopant ions from a side of the magnetoresistive tunnel junction includes:
injecting the dopant ions to the magnetoresistive tunnel junction that is exposed;
where there is an angle between a direction of the injecting and a direction perpendicular to the substrate, and a projection of the direction of the injecting on the substrate is non-parallel to a direction of a current in the spin-orbit coupling layer.

Optionally, the thermal annealing is Joule thermal annealing, annealing-furnace annealing, or rapid thermal annealing.

Optionally, the dopant ions include N ions. As ions, Ar ions, Be ions, or P ions.

Optionally, the magnetoresistive tunnel junction further includes a pinning layer and a protective layer, where the pinning layer is disposed on the second magnetic layer, and the protective layer is disposed on the pinning layer.

A multi-state memory is provided, including:
a spin-orbit coupling layer; and
a magnetoresistive tunnel junction, disposed on the spin-orbit coupling layer,
where the magnetoresistive tunnel junction includes a first magnetic layer, a tunneling layer and a second magnetic layer that are sequentially stacked from bottom to top, and the first magnetic layer and the second magnetic have perpendicular anisotropy;
where the magnetoresistive tunnel junction includes dopant ions, and a gradient of a concentration of the dopant ions is formed in the magnetoresistive tunnel junction along a direction perpendicular to a direction of a current that is in a plane in which the spin-orbit coupling layer is located.

Optionally, the dopant ions include N ions, As ions, Ar ions, Be ions, or P ions.

Optionally, the magnetoresistive tunnel junction further includes a pinning layer and a protective layer, where the pinning layer is disposed on the second magnetic layer, and the protective layer is disposed on the pinning layer.

Optionally, a material of the first magnetic layer and the second magnetic layer is Co, Fe, CoFeB, or FePt.

According to the multi-state memory and the method for manufacturing the multi-state memory in embodiments of the present disclosure, the magnetoresistive tunnel junction is disposed on the spin-orbit coupling layer, and the thermal annealing is performed after the dopant ions are injected from the side of the magnetoresistive tunnel junction. Thereby, the concentration of dopant ions in the magnetoresistive tunnel junction has a gradient variation along the direction that is perpendicular to the direction of the current and within the plane in which the spin-orbit coupling layer is located. Accordingly, symmetry along the direction perpendicular to the direction of the current is broken. In a case a current flows into the spin-orbit coupling layer, resistance are outputted in multiple states in linearity with the current. The multi-state storage is achieved. It can meet a requirement on hardware of neural network synapses, and is applicable to calculation in a neural network.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

FIGS. 7 and 7A are schematic structural diagrams of a memory in a process of a method for manufacturing the memory according to a second embodiment of the present disclosure; and

DETAILED DESCRIPTION OF EMBODIMENTS

For making the objects, features and advantages of the present disclosure clear and easy to understand, the embodiments of the present disclosure are described in detail hereinafter in conjunction with the drawings.

In the following description, numerous specific details are illustrated in order to provide a thorough understanding of the disclosure. The disclosure may also be carried out in ways other than those described herein. A person skilled in the art can make a similar deduction without departing from the spirit of the disclosure, and thus the disclosure is not limited by the specific embodiments disclosed hereinafter.

Further, the present disclosure is described in detail in conjunction with the schematic diagrams. In detailed description of the embodiments of the present disclosure, for the convenience of description, the cross-sectional diagram showing the structure of the apparatus may not be partially enlarged according to the general proportion. The schematic diagrams are only examples, which are not intended to limit the scope of the disclosure. Furthermore, it should include the three-dimensional dimensions of length, width and depth in the practical production.

A method for manufacturing a multi-state memory is provided according to an embodiment of the present disclosure. A spin current is generated based on spin-orbit coupling, thereby magnetic moment of a magnet is induced to be switched, and a multi-state output is achieved. For better understanding of the technical solutions and technical effects of the present disclosure, hereinafter specific embodiments are described in detail in conjunction with a flowchart.

First Embodiment

In this embodiment, ion injection is performed after a mask layer is formed on a side of a magnetoresistive tunnel junction, and thereby dopant ions are injected from another side of the magnetoresistive tunnel junction. Thermal annealing is performed afterwards, so that there are a small amount of the dopant ions diffusing to the side of the magnetoresistive tunnel junction at which the dopant ions are not injected. Thereby, a concentration of the dopant ions in the magnetoresistive tunnel junction has a gradient variation in a direction perpendicular to a direction of a current, within the plane in which the spin-orbit coupling layer is located.

Figure 1:
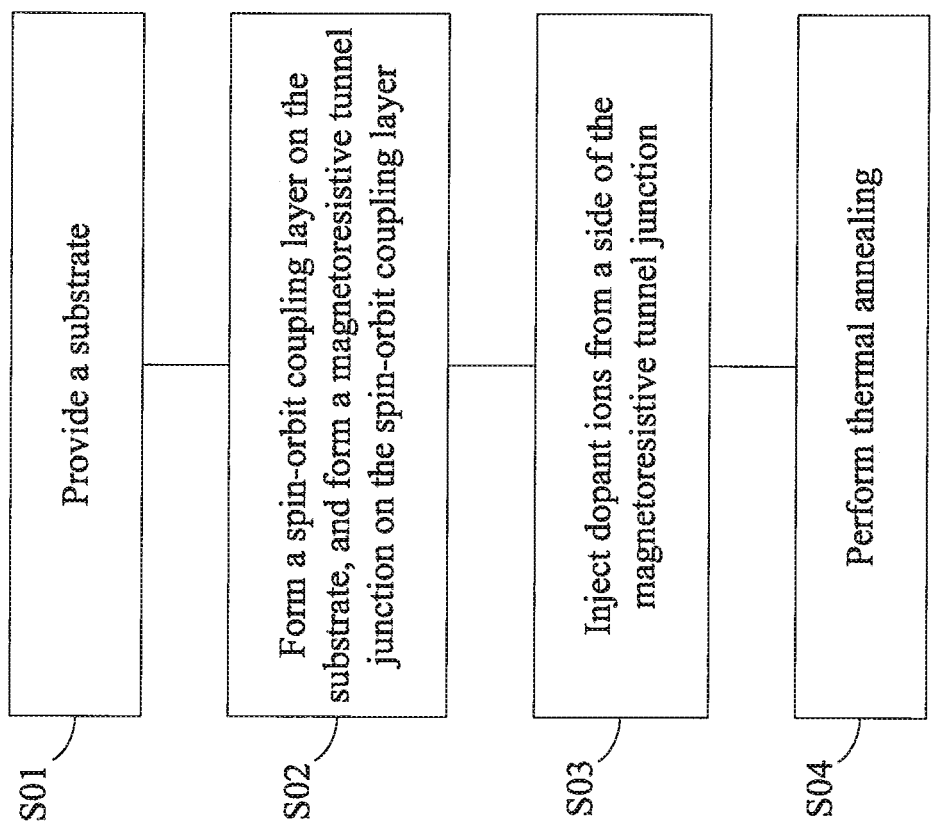
FIG. 1 is a flowchart of a method for manufacturing a multi-state memory according to an embodiment of the present disclosure.

Reference is made to FIG. 1. In step S01, a substrate 10 is provided, as referring to FIG. 2.

In one embodiment of the present disclosure, the substrate 10 mainly serves as a support, and may be a semiconductor substrate or other substrates. The semiconductor substrate may be a Si substrate, a Ge substrate, a SiGe substrate, SOI (silicon on insulator), GOI (germanium on Insulator), or the like. In this embodiment, the substrate 10 may be a silicon substrate.

Figure 3:
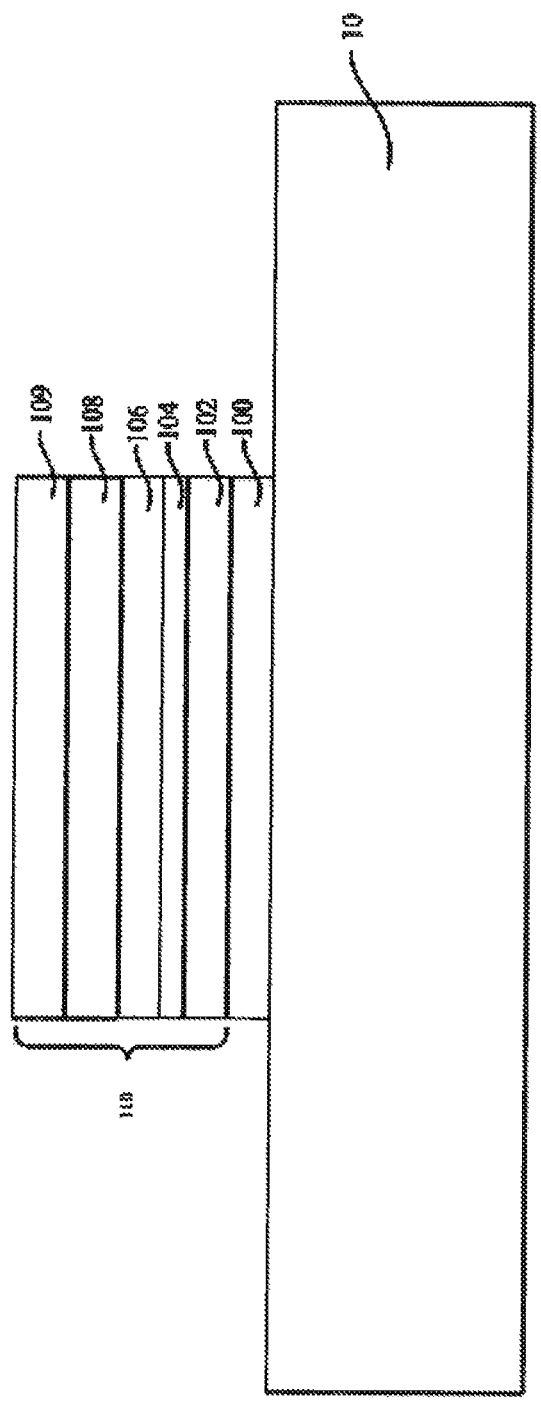

In step S02, a spin-orbit coupling layer 100 is formed on the substrate, and a magnetoresistive tunnel junction 110 is formed on the spin-orbit coupling layer 100. The magnetoresistive tunnel junction 110 includes a first magnetic layer 102, a tunneling layer 104 and a second magnetic layer 106 that are sequentially stacked from bottom to top. The first magnetic layer 102 and the second magnetic 106 have perpendicular anisotropy. Reference is made to FIG. 3.

In one embodiment of the present disclosure, the spin-orbit coupling layer 100 is made of a material having a spin-orbit coupling effect. Generally, the spin-orbit coupling layer 100 may be a metal layer or a topological insulator layer having a spin coupling effect. Preferably, a material having a strong spin-orbit coupling may be selected. A material of the metal layer may be Ta, Pt, W, Hf, Ir, CuBi, CuIr, AuW, or the like. A material of the topological insulator layer may be BiSn, SnTe, BiSe, or other IVA, VA or VIA compounds.

The magnetoresistive tunnel junction 110 includes the first magnetic layer 102, the tunneling layer 104 and the second magnetic layer 106 that are sequentially stacked from bottom to top. The first magnetic layer 102 and the second magnetic layer 106 are made of a ferromagnetic material having perpendicular anisotropy. The ferromagnetic material may be an elementary ferromagnetic material, an alloy ferromagnetic material, a magnetic metal oxide, or the like. For example, the ferromagnetic material may be hard magnetic materials such as Co, Fe, CoFeB or FePt. Materials of the first magnetic layer 102 and the second magnetic layer 106 may be same or different according to a specific requirement.

The tunneling layer 104 is disposed between the first magnetic layer 102 and the second magnetic layer 106, and may be made of a non-magnetic metal or an insulating material. The non-magnetic metal may be Cu, Ag, or the like. The insulating material may be alumina, magnesia, cerium oxide, or the like.

Further, the magnetoresistive tunnel junction 110 may further include a pinning layer 108 on the second magnetic layer 106. The pining layer 108 is configured to pin a direction of magnetization. To facilitate description, the pinning layer 108 on the second magnetic layer 106 is referred to as a top pinning layer. Further, the magnetoresistive tunnel junction 110 may further include a protective layer 109 on the top pinning layer 108. The protective layer 109 is configured to prevent the magnetoresistive tunnel junction 110 from being oxidized. Generally, the protective layer 109 may be a metal material such as Ta, Ru, or the like.

Figure 2:
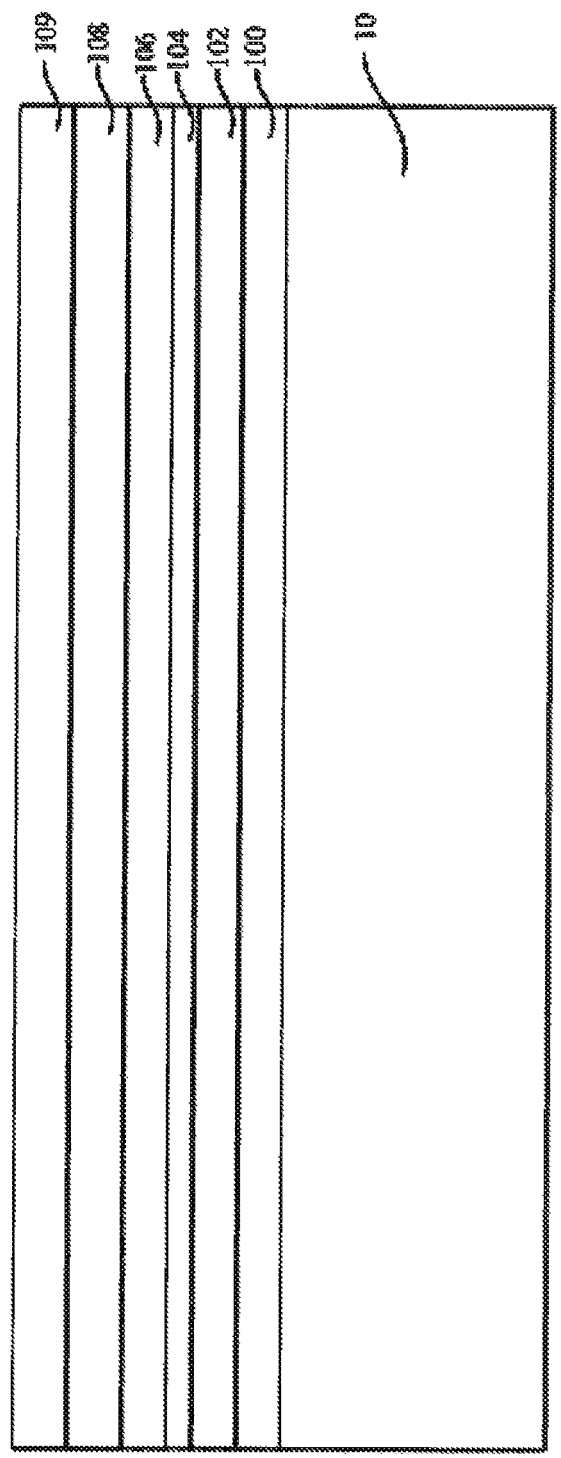
FIGS. 2 to 6A are schematic structural diagrams of a memory in a process of a method for manufacturing the memory according to a first embodiment of the present disclosure.

In a specific embodiment, reference is made to FIG. 2. A material of the magnetoresistive tunnel junction 110 may continue to be grown after growing the spin-orbit coupling layer 100. Afterwards, patterning is performed firstly on the spin-orbit coupling layer 100 and then on the magnetoresistive tunnel junction 110, as referring to FIG. 3.

Specifically, the spin-orbit coupling layer 100, the first magnetic layer 102, the tunneling layer 104, the second magnetic layer 106, the pinning layer 108 and the protective layer 109 are sequentially grown first, as shown in FIG. 2.

The spin-orbit coupling layer 100 made of a metal material such as Ta, Pt or the like may be grown by a PVD (physical vapor deposition) method, and a thickness thereof may be 3-5 nm as an example. In other embodiments, the spin-orbit coupling layer 100 made of a topological insulator material such as BiSn, SnTe or the like may be grown by a MBE (molecular beam epitaxial) method, and a thickness thereof may be 3-10 nm as an example.

Then, as an example, the first magnetic layer 102 made of Co/CoFeB or the like, the tunneling layer 104 made of MgO, the second magnetic layer 106 made of Co/CoFeB or the like, the artificial antiferromagnetic pinning layer 108 made of a CoPt multilayer film, and the protective layer 109 made of Ta are sequentially grown by sputtering or other suitable means. Thickness of the above layers may be approximately 1 nm, 0.8 nm, 1 nm, 4-6 nm, and 4-6 nm, sequentially.

Afterwards, the protective layer 109, the pinning layer 108, the second magnetic layer 106, the tunneling layer 104, the first magnetic layer 102, and the spin-orbit coupling layer 100 are etched to a surface of the substrate 10, forming a patterned spin-orbit coupling layer 100. Then, the protective layer 109, the pinning layer 108, the second magnetic layer 106, the tunneling layer 104, and the first magnetic layer 102 is further etched, to form a patterned magnetoresistive tunnel junction 110 on the spin-orbit coupling layer 100, as referring to FIG. 3.

It should be noted that, according to the present disclosure, the current I in the spin-orbit coupling layer 100 is a current that is applied for switching the magnetic moment in the induced magnetoresistive tunnel junction 110, namely, is a current applied for writing data information. Herein the direction of the current I refers to a forward direction +I or a reverse direction −I along a dimension in which the current flows.

To facilitate description, the direction of the current I is called a length direction of the spin-orbit coupling layer, and the direction that is perpendicular to the current I and in a plane in which the spin-orbit coupling layer is located is called a width direction Y. In one specific embodiment, the spin-orbit coupling layer 100 may be a structure of a strip-shaped channel. The magnetoresistive tunnel junction 110 may be disposed in middle of the spin-orbit coupling layer 100, along the length direction of the spin-orbiting coupling layer 100. The magnetoresistive tunnel junction 110 may be symmetrically disposed with respect to a central axis that is along the length direction of the spin-orbit coupling layer 100. In one embodiment, a shape and a size of the magnetoresistive tunnel junction 110 may be set on requirement. In one preferable embodiment, the magnetoresistive tunnel junction 110 may be a strip, and a width of the strip is substantially identical to or different from a width of the spin-orbit coupling layer 100.

Figure 5:
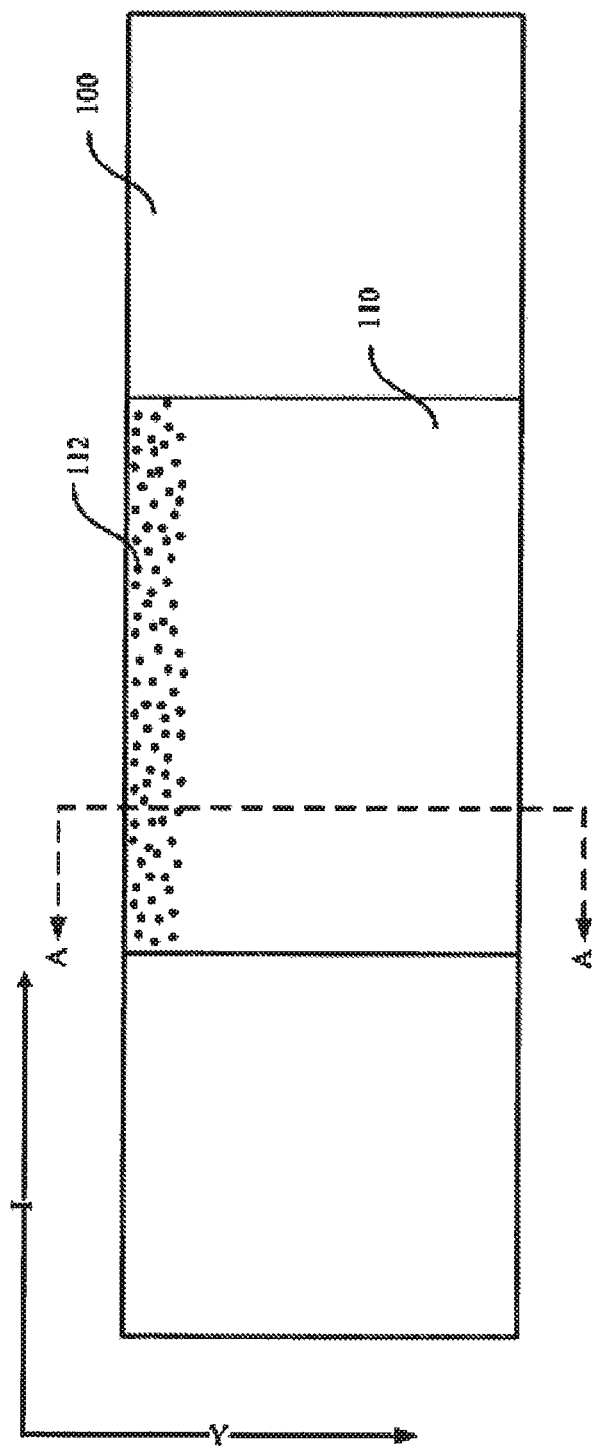
Figure 5A:
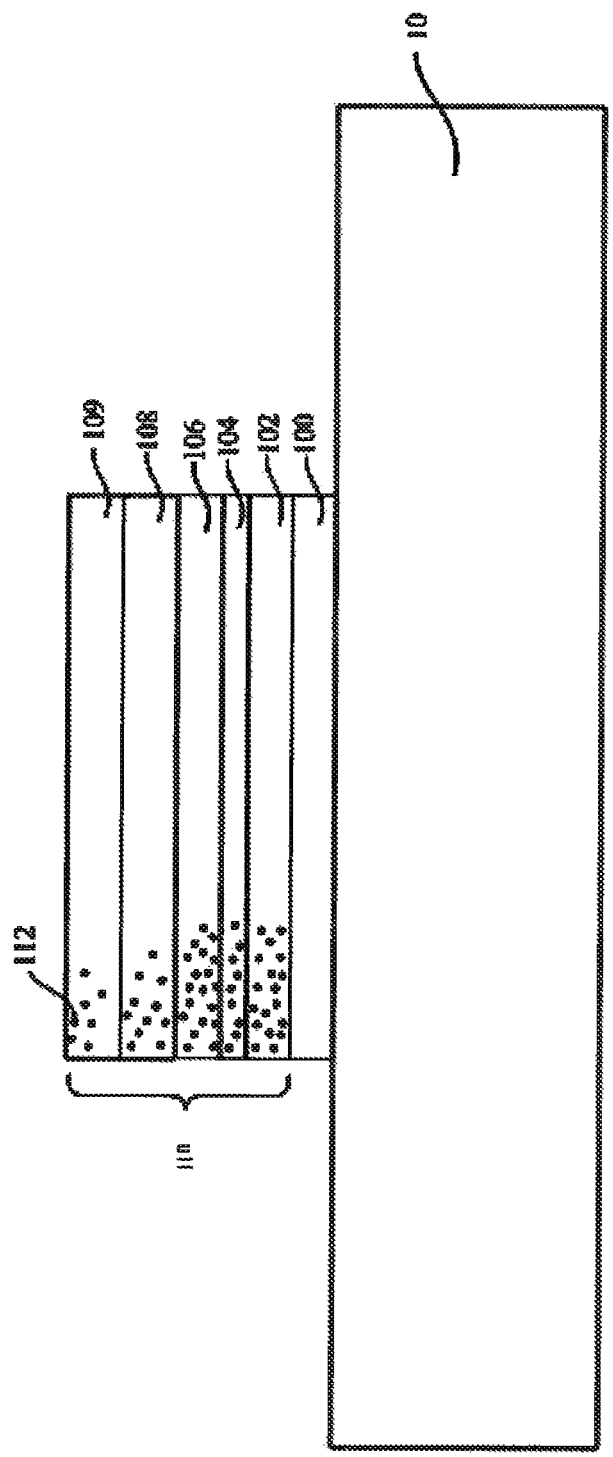

In step S03, dopant ions 112 are injected from a side of the magnetoresistive tunnel junction 110, as shown in FIG. 5 (a top view) and FIG. 5A (a cross-sectional view along the AA direction in FIG. 5).

In this step, the dopant ions that are injected may be any ions. Preferably, the injected ions may be any ions capable to be injected by a conventional ion injector, such as N ions. As ions, Be ions, Ar ions, P ions, or B ions. In addition, the ions to be injected and a dose thereof may be selected during injection according to a specific requirement. In one embodiment, ions with a small atomic radius may be used to reduce damage to a crystal lattice of the tunnel junction, and the injection dose may be high to enhance an effect of switching. In another embodiment, ions with a large atomic radius may be selected, which may cause serious damage to the crystal lattice of the tunnel junction and have a good effect of switching. In such case, the injection dose may be small to reduce the damage to the lattice.

In this step of this embodiment, the ions are injected from one side of the magnetoresistive tunnel junction 110, and no ions are injected from the other side. The side for injection is a lateral side with respect to the direction of current I in the spin-orbit coupling layer. Specifically, the ions may be injected by following steps.

Figure 4:
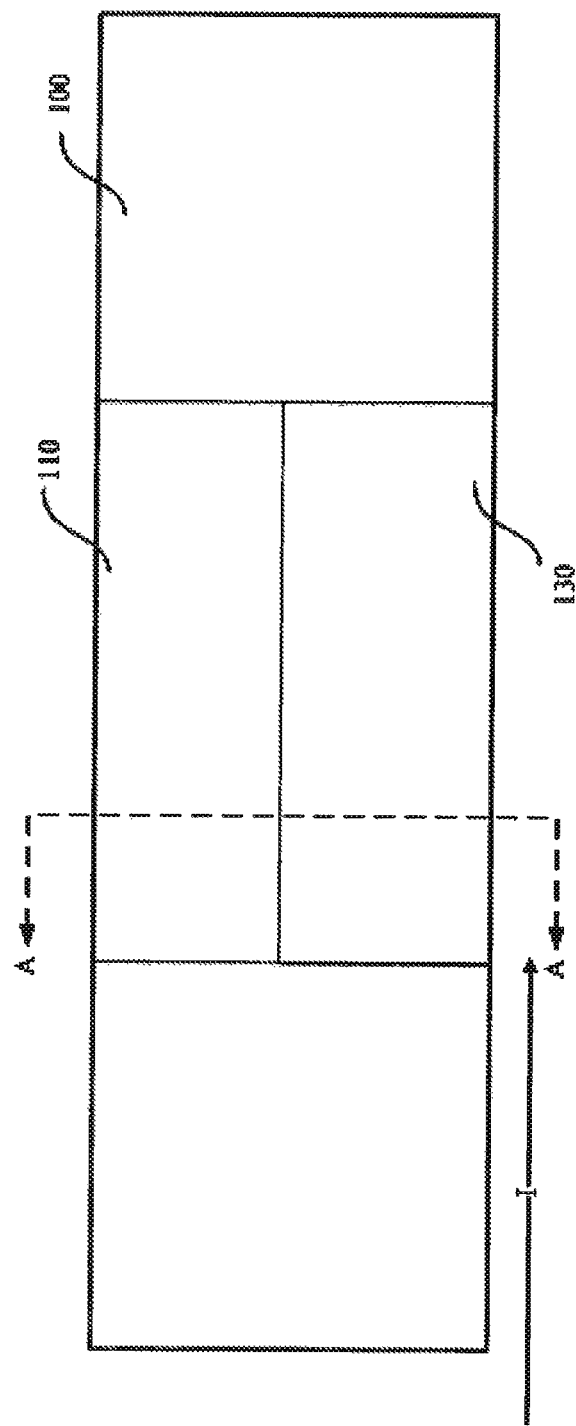
Figure 4A:
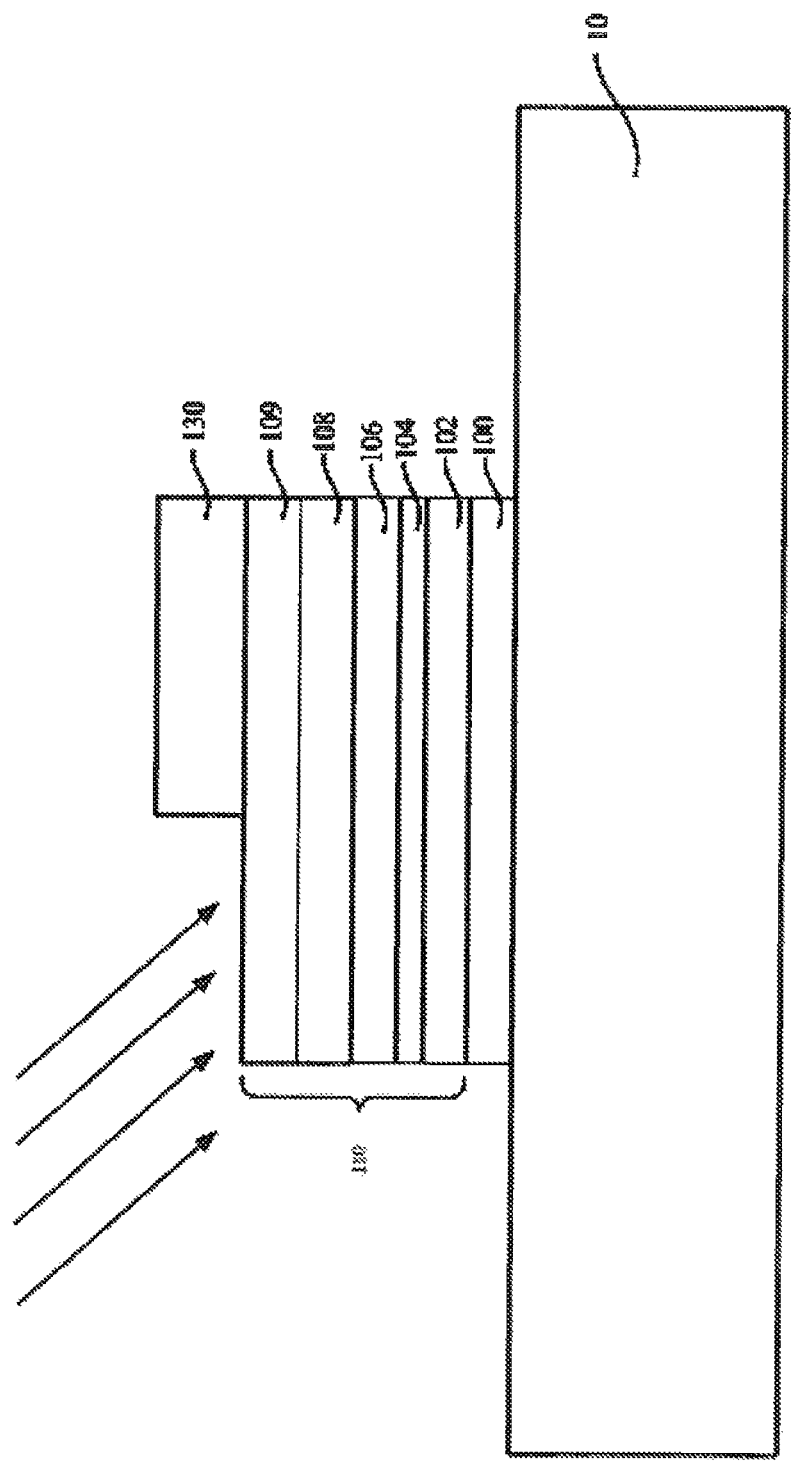

First, the mask layer 130 may be formed on the magnetoresistive tunnel junction 110 at a lateral side with respect to the direction of current I in the spin-orbit coupling layer 110. Reference is made to FIG. 4 (a top view) and FIG. 4A (a cross-sectional view along the AA direction in FIG. 4).

The mask layer 130 may be a photoresist. The mask layer 130 made of the photoresist may be formed by a photoresist material through spin coating and then using photolithographic techniques. In one specific embodiment, the mask layer 130 covers at least the lateral side of the magnetoresistive tunnel junction 110 with respect to the direction of the current I. The mask layer 130 may further cover the exposed spin-orbit coupling layer 100 and a surface of the substrate 10.

Then, the ions are injected. Thus, the dopant ions 112 are injected into the magnetoresistive tunnel junction 110 from a lateral side that is not covered with the mask layer 130. Afterwards, the mask layer 130 is removed, as shown in FIGS. 5 and 5A. In the width direction of the spin-orbit coupling layer, a part of the magnetoresistive tunnel junction 110 is injected with dopant ions, and another part of the magnetoresistive tunnel junction 110 is not injected with dopant ions. It can be understood that the dopant ions may also be injected into the spin-orbit coupling layer 100 during the ion injection according to different process control. In a specific ion injection, ions may be injected from a direction perpendicular to the substrate plane or with a certain oblique angle with respect to the substrate plane. Through process control, such as controlling energy, a concentration or an angle of the injection, peaks of a depth and a concentration of the injected ions can be controlled to be within the magnetic layers. Thereby, an injection depth along the width direction is larger in the first magnetic layer 102 and the second magnetic layer 106 than other layers in the magnetoresistive tunnel junction.

Figure 6:
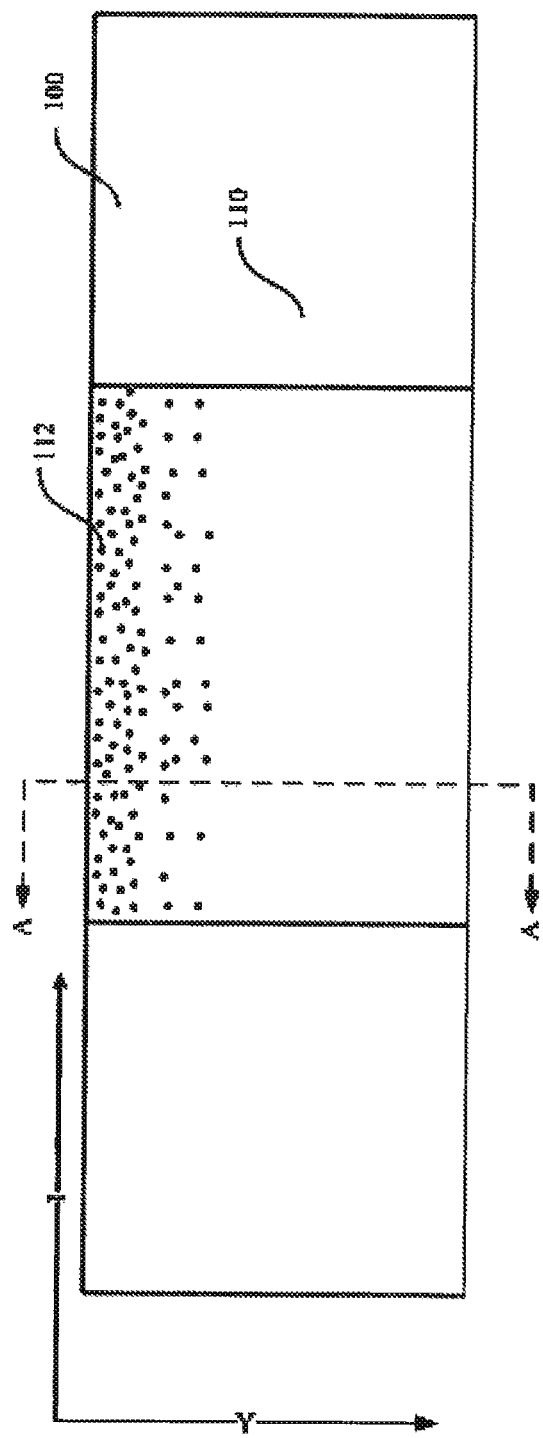

In step S04, thermal annealing is performed. Reference is made to FIG. 6 (a top view) and FIG. 6A (a cross-sectional view along the AA direction in FIG. 4).

In the thermal annealing, the injected dopant ions are further diffused, such that a small amount of dopant ions are diffused toward another lateral side of the magnetoresistive tunnel junction at which the dopant ions are not injected. Thereby, a gradient of the concentration of the dopant ions is formed in the magnetoresistive tunnel junction 110, along the width direction Y of the spin-orbit coupling layer, to a state with no dopant ion. The state with no dopant ion means that the dopant concentration is substantially zero. Dopant with low concentration is dopant ions diffused from the lateral side at which the ions are injected, and is located at an interface between the lateral side at which the ions are injected and the lateral side from which the ions are not injected. Dopant with high concentration is dopant ions located at the lateral side at which the ions are injected.

In specific application, the thermal annealing process may be Joule thermal annealing, annealing-furnace annealing, rapid thermal annealing, or the like. Specific conditions for processing may be set according to a specific requirement. In one embodiment, a device is annealed under a current of $2\times10^7$ A/cm$^2$ for 15 s.

In this embodiment of the present disclosure, the concentration of dopant ions in the magnetoresistive tunnel junction has a gradient variation along the direction perpendicular to the direction of the current within the plane in which the spin-orbit coupling layer is located. Accordingly, symmetry along the direction perpendicular to the direction of the current is broken. In a case a current flows into the spin-orbit coupling layer, resistance are outputted in multiple states in linearity with the current. The multi-state storage is achieved. It can meet a requirement on hardware of neural network synapses, and is applicable to calculation in a neural network.

Thus, the multi-state memory is formed according to embodiments of the present disclosure. The multi-state memory is based on a structure of the SOT-MRAM device, and other components may be processed on requirement.

Second Embodiment

This embodiment is different from the first embodiment in that the ions are injected under an angle into the magnetoresistive tunnel junction that is exposed, and then the thermal annealing is performed. By controlling an injection angle of the dopant ions, the concentration of dopant ions in the magnetoresistive tunnel junction has a gradient variation along the direction perpendicular to the direction of the current within the plane in which the spin-orbit coupling layer is located. Hereinafter differences from the first embodiment will be emphasized, and identical parts are not described again.

In step S201, a substrate 10 is provided, as shown in FIG. 2.

In step S202, a spin-orbit coupling layer 100 is formed on the substrate 10, and a magnetoresistive tunnel junction 110 is formed on the spin-orbit coupling layer 100. The magnetoresistive tunnel junction 110 includes a first magnetic layer 102, a tunneling layer 104 and a second magnetic layer 106 that are sequentially stacked from bottom to top. The first magnetic layer 102 and the second magnetic 106 have perpendicular anisotropy. Reference is made to FIG. 3.

The steps S201 and S202 are identical to the steps S01 and S02 in the first embodiment.

In step S203, dopant ions are injected from a side of the magnetoresistive tunnel junction 110, as referring to FIG. 7 and FIG. 7A (a cross-sectional view along the AA direction in FIG. 7).

In step S204, thermal annealing is performed.

In this embodiment of the present disclosure, the magnetoresistive tunnel junction is exposed for injecting the dopant ions. There is an angle between a direction of the injecting and a direction perpendicular to the substrate. A projection of the direction of the injecting on the substrate is non-parallel to a direction of a current I in the spin-orbit coupling layer.

To facilitate description, a direction perpendicular to a plane in which the spin-orbit coupling layer 100 is located is referred to as Z direction. An angle between the direction of the injecting and a side of the plane IZ may be an acute angle during injection. Namely, the injecting from the side is performed with an oblique angle. The injecting angle may be kept constant during the injection, or may be changed while keeping the angle between the direction of the injecting and the side of the plane IZ to be an acute angle. Preferably, the angle ranges from 30° to 60°.

Further, the projection of the direction of the injecting on the substrate is perpendicular to the direction of the current I in the spin-orbit coupling layer. The dopant ions in the magnetoresistive tunnel junction have a large gradient variation in concentration along the direction perpendicular to the direction of the current I.

As in the first embodiment, the injected dopant ions may be any ions. Preferably, the injected ions may be ions capable to injected by a conventional ion injector, such as N ions, As ions, Be ions, Ar ions, P ions, B ions, or the like. In addition, the ions to be injected and a dose thereof may be selected according to a specific requirement during injection. The thermal annealing may be Joule thermal annealing, annealing-furnace annealing, rapid thermal annealing, or the like. A specific condition for processing may be set on requirement.

During injecting the ions, the magnetoresistive tunnel junction 110 is not covered by a mask layer and in a fully exposed state. The injection totally depends on a shielding property of a structure to which the ions are injected under an angle. Due to being shielded by the magnetoresistive tunnel junction itself, the side of the magnetoresistive tunnel junction that faces the injection is injected with more dopant ions than the opposite side. Thereby, the concentration of dopant ions in the magnetoresistive tunnel junction has a gradient variation along a direction that is perpendicular to the direction of the current and in the plane in which the spin-orbit coupling layer is located, after the thermal annealing. Accordingly, symmetry along the direction perpendicular to the direction of the current is broken. In a case a current flows into the spin-orbit coupling layer, resistance are outputted in multiple states in linearity with the current. The multi-state storage is achieved. It can meet a requirement on hardware of neural network synapses, and is applicable to calculation in a neural network.

Figure 6A:
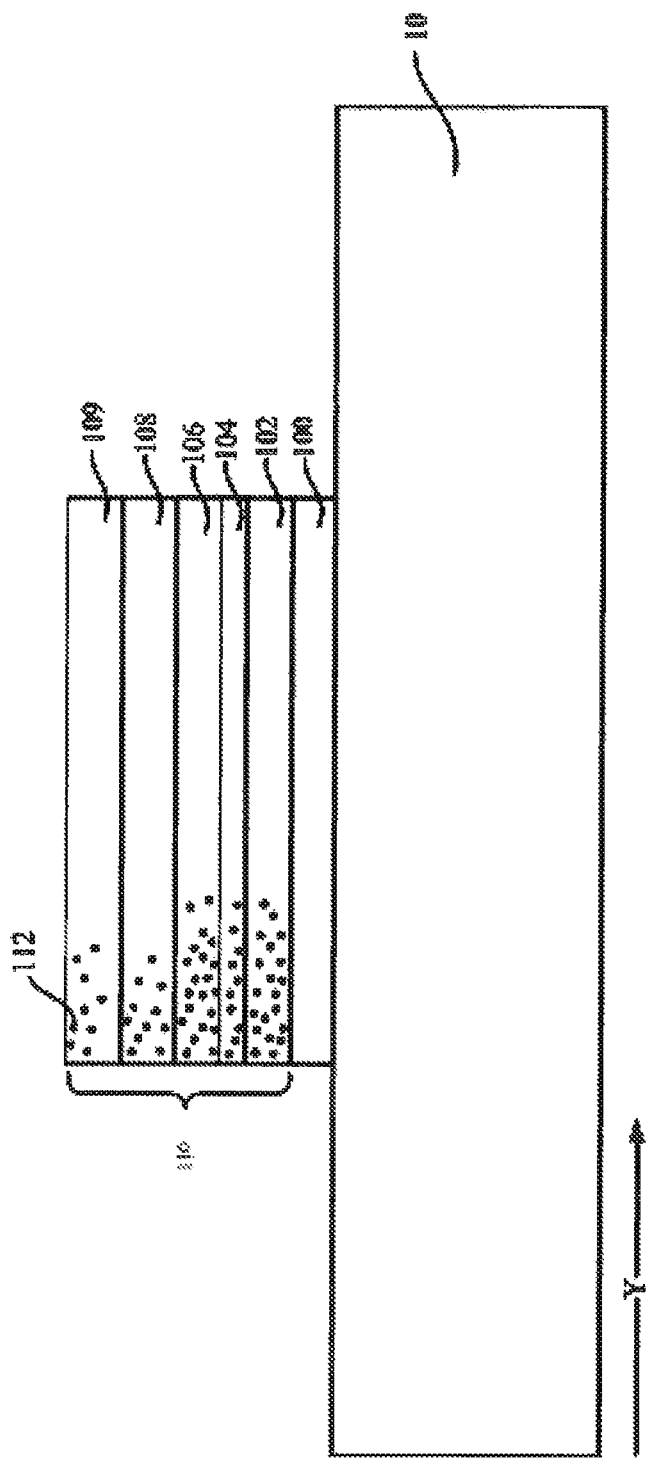

Hereinabove the method for manufacturing the multi-state memory according to embodiments of the present disclosure has been described in detail. Further, a multi-state memory formed by the above method is provided according to an embodiment of the present disclosure. Reference is made to FIG. 6 and FIG. 6A.

The multi-state memory includes a spin-orbit coupling layer 100, and a magnetoresistive tunnel junction 110 disposed on the spin-orbit coupling layer 100.

The magnetoresistive tunnel junction 110 includes a first magnetic layer 102, a tunneling layer 104 and a second magnetic layer 106 that are sequentially stacked from bottom to top. The first magnetic layer 102 and the second magnetic 106 have perpendicular anisotropy.

The magnetoresistive tunnel junction 110 includes dopant ions 112. A gradient of a concentration of the dopant ions 112 is formed in the magnetoresistive tunnel junction 110 along a direction Y perpendicular to a direction of a current I within a plane in which the spin-orbit coupling layer 100 is located.

In some embodiments, the concentration of dopant ions 112 in the magnetoresistive tunnel junction 110 reduces to a state with no dopant ion along the direction Y.

In some other embodiments, a concentration of the dopant ions 112 at a side of the magnetoresistive tunnel junction 110 is higher than a concentration of the dopant ions at another side.

Further, the dopant ions include N ions, As ions, Ar ions, Be ions or P ions.

Further, the magnetoresistive tunnel junction further includes a pinning layer on the second magnetic layer and a protective layer on the pinning layer.

Further, a material of the first magnetic layer and the second magnetic layer may be Co, Fe, CoFeB or FePt.

In one specific embodiment, the aforementioned multi-state memories may be arranged in an array, to form a storage array. The storage array may be independent from or integrated into a device using the storage array. As an example, the device may be a processor, an application specific integrated circuit, a system on chip, or the like.

The embodiments of the present disclosure are described in a progressive manner, and each embodiment places emphasis on the difference from other embodiments.

Therefore, one embodiment can refer to other embodiments for the same or similar parts. Since apparatuses disclosed in the embodiments correspond to methods disclosed in the embodiments, the description of the apparatuses is simple, and reference may be made to the relevant part of the methods.

The foregoing embodiments are only preferred embodiments of the present disclosure. The preferred embodiments according to the disclosure are disclosed above, and are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure.

All simple modifications, equivalent variations and improvements made based on the technical essence of the present disclosure without departing the content of the technical solutions of the present disclosure fall within the protection scope of the technical solutions of the present disclosure.

The invention claimed is:

1. A method for manufacturing a multi-state memory, comprising:
   providing a substrate;
   forming a spin-orbit coupling layer on the substrate;
   forming a magnetoresistive tunnel junction on the spin-orbit coupling layer, wherein the magnetoresistive tunnel junction comprises a first magnetic layer, a tunneling layer and a second magnetic layer that are sequentially stacked from bottom to top, and the first magnetic layer and the second magnetic have perpendicular anisotropy;
   injecting dopant ions from a side of the magnetoresistive tunnel junction; and
   performing thermal annealing;
   wherein injecting the dopant ions from a side of the magnetoresistive tunnel junction comprises:
      injecting the dopant ions to the magnetoresistive tunnel junction that is exposed, wherein there is an angle between a direction of the injecting and a direction perpendicular to the substrate, a projection of the direction of the injecting on the substrate is non-parallel to a direction of a current in the spin-orbit coupling layer.

2. The method according to claim 1, wherein injecting the dopant ions from a side of the magnetoresistive tunnel junction comprises:
   forming a mask layer on another side of the magnetoresistive tunnel junction, wherein the side of the magnetoresistive tunnel junction is not covered with the mask layer;
   injecting the dopant ions; and
   removing the mask layer.

3. The method according to claim 1, wherein the thermal annealing is Joule thermal annealing, annealing-furnace annealing, or rapid thermal annealing.

4. The method according to claim 1, wherein the dopant ions comprise N ions, As ions, Ar ions, Be ions, or P ions.

5. The method according to claim 1, wherein:
   the magnetoresistive tunnel junction further comprises a pinning layer and a protective layer, and
   the pinning layer is disposed on the second magnetic layer, and the protective layer is disposed on the pinning layer.

6. The method according to claim 1, wherein the current is applied to switch magnetic moment in the magnetoresistive tunnel junction.

7. A multi-state memory, comprising:
   a spin-orbit coupling layer; and
   a magnetoresistive tunnel junction, disposed on the spin-orbit coupling layer, wherein the magnetoresistive tunnel junction comprises a first magnetic layer, a tunneling layer and a second magnetic layer which are sequentially stacked from bottom to top, and the first magnetic layer and the second magnetic have perpendicular anisotropy;
   wherein the magnetoresistive tunnel junction comprises dopant ions, and a gradient of a concentration of the dopant ions is formed in the magnetoresistive tunnel junction along a first direction, a projection of the first direction on the substrate is non-parallel to a direction of a current in the spin-orbiting layer, and the current is applied to switch magnetic moment in the magnetoresistive tunnel junction.

8. The multi-state memory according to claim 7, wherein the dopant ions comprise N ions, As ions, Ar ions, Be ions, or P ions.

9. The multi-state memory according to claim 7, wherein:
   the magnetoresistive tunnel junction further comprises a pinning layer and a protective layer, and
   the pinning layer is disposed on the second magnetic layer, and the protective layer is disposed on the pinning layer.

10. The multi-state memory according to claim 7, wherein a material of the first magnetic layer and the second magnetic layer is Co, Fe, CoFeB, or FePt.

11. The multi-state memory according to claim 7, wherein the gradient of the concentration of the dopant ions changes monotonously along the first direction.

* * * * *